(12) United States Patent
Carter

(10) Patent No.: US 6,310,794 B1
(45) Date of Patent: Oct. 30, 2001

(54) UPGRADABLE STORAGE SYSTEM

(75) Inventor: Timothy L. Carter, Caldwell, ID (US)

(73) Assignee: Hewlett-Packard Co., Palo Alto, CA (US)

( * ) Notice: Subject to any disclaimer, the term of this patent is extended or adjusted under 35 U.S.C. 154(b) by 0 days.

(21) Appl. No.: 09/709,048

(22) Filed: Nov. 9, 2000

(51) Int. Cl.[7] ............................... G11C 5/02; H01L 23/02
(52) U.S. Cl. ............................. 365/52; 365/63; 257/685; 257/686; 257/723; 257/777
(58) Field of Search .................................. 365/51, 52, 63; 257/685, 686, 777, 723, 724, 727

(56) References Cited

U.S. PATENT DOCUMENTS

| | | | | |
|---|---|---|---|---|
| 5,281,852 | * | 1/1994 | Normington | 257/685 |
| 5,481,133 | * | 1/1996 | Hsu | 257/621 |
| 5,963,430 | * | 10/1999 | Londa | 361/790 |
| 6,093,029 | * | 7/2000 | Kwon et al. | 439/69 |

* cited by examiner

Primary Examiner—Son Mai

(57) ABSTRACT

The present disclosure relates to an upgradable storage system. The storage system comprises a memory device compartment that is adapted to receive memory devices in a stacked orientation, and at least one memory device disposed within the memory device compartment. Typically, each of the memory devices has electrical contacts disposed on top and bottom surfaces of the memory devices with which the memory devices electrically connect to each other. In a preferred arrangement, each memory device comprises an ARS device.

25 Claims, 7 Drawing Sheets

UPGRADABLE STORAGE SYSTEM

FIELD OF THE INVENTION

The present disclosure relates to an upgradable storage system. More particularly, the disclosure relates to an upgradable storage system that uses a vertical stacking connection scheme.

BACKGROUND OF THE INVENTION

The miniaturization of electronic components has enabled similar miniaturization of many electronic devices such as mobile telephones, personal organizers, cameras, and so forth. As demand for smaller and smaller electronic devices increases, less and less space is available within the devices for electronic components needed to operate the devices.

Many electronic devices include memory devices that are used to store information such as contact information, word processor files, image files, etc. Normally, electronic devices such as those mentioned above include one or more memory devices (e.g., solid-state devices) that provide for storage of this information. Typically, however, the amount of storage in these devices typically is fixed in that no provision is made for adding or replacing existing memory. Although it would be possible to provide this functionality by enabling the user to, for instance, replace an internal circuit board within the device as with personal computers, the user would be required to disassemble the electronic device to add or replace the memory. Moreover, due to the small size of handheld devices, there may not be enough room for extra memory in that such memory normally requires a larger printed circuit board.

From the foregoing, it can be appreciated that it would be desirable to have an upgradable storage system with which the user can increase the available memory of an electronic device both quickly and easily.

SUMMARY OF THE INVENTION

The present disclosure relates to an upgradable storage system. The storage system comprises a memory device compartment that is adapted to receive memory devices in a stacked orientation, and at least one memory device disposed within the memory device compartment. Typically, each of the memory devices has electrical contacts disposed on its top and bottom surfaces. The electrical contacts permit the memory devices to electrically connect to each other. In a preferred arrangement, each memory device comprises an ARS device.

The features and advantages of the invention will become apparent upon reading the following specification, when taken in conjunction with the accompanying drawings.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

Figure 1:
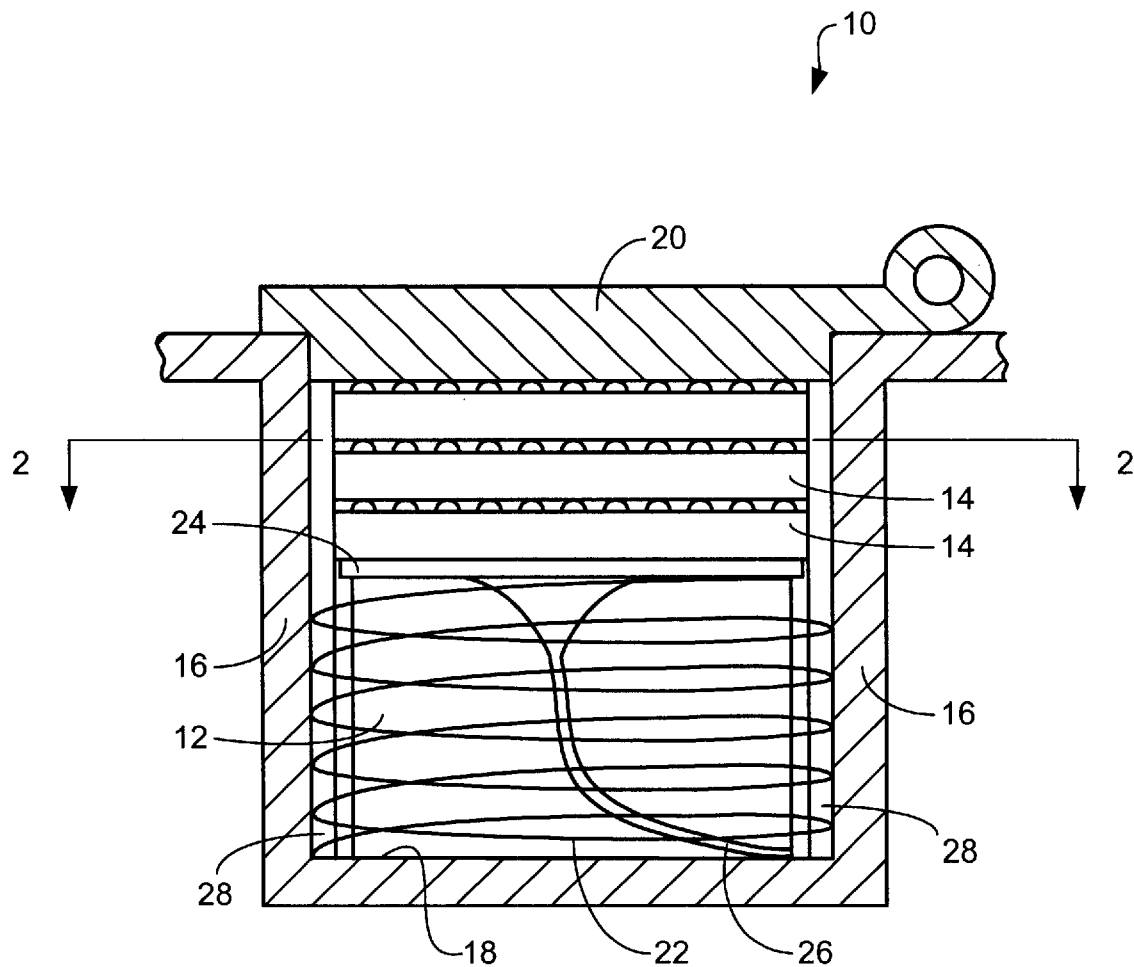
FIG. 1 is a schematic side view of an upgradable storage system of the present invention.
Figure 2:
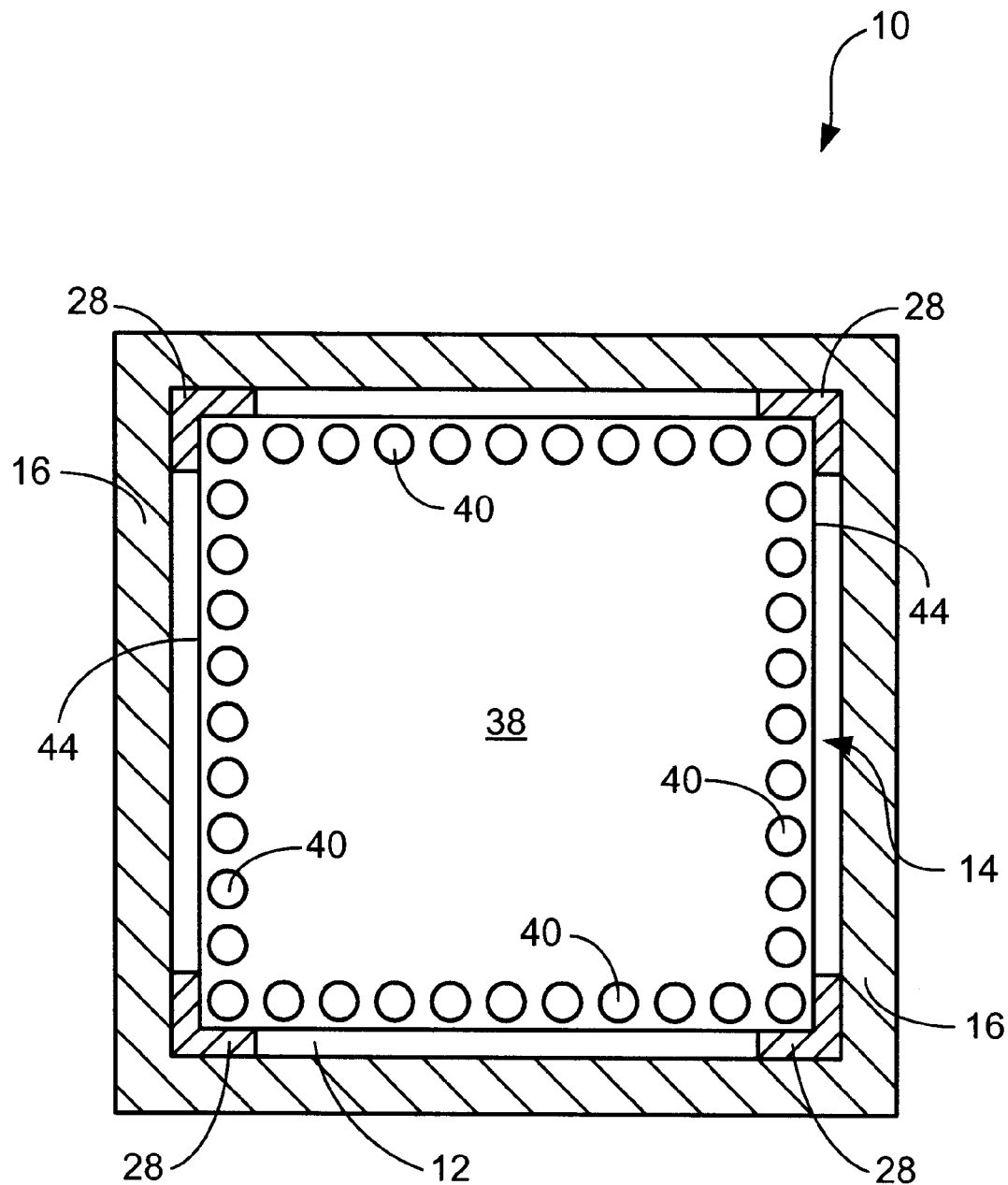
FIG. 2 is schematic top view of the storage system of FIG. 1.

Referring now in more detail to the drawings, in which like numerals indicate corresponding parts throughout the several views, FIGS. 1 and 2 illustrate an upgradable storage system 10 of the present invention. As will be appreciated by persons having ordinary skill in the art, this storage system 10 can be provided in substantially any electronic device which requires memory. Preferably, however, the storage system 10 is provided in a portable or hand-held electronic device such as a mobile telephone, personal organizer, camera, or similar device.

Irrespective of the type of device in which the upgradable storage system 10 is used, the system typically comprises a memory device compartment 12 that is adapted to house a plurality of memory devices 14 that are described in greater detail below. By way of example, the compartment 12 can be formed with a plurality of compartment walls 16 and a bottom surface 18. Typically, the memory devices 14 are arranged in a vertically stacked orientation as indicated in FIG. 1 such that electrical contact is made between each adjacent memory device 14. The storage system 10 further includes a closure mechanism 20 that is used to close the memory device compartment 12 to retain and encapsulate the memory devices 14. Normally, the closure mechanism 20 can be opened by the user such that access can be gained to the memory device compartment 12. As is discussed below, the user can increase the memory capacity of the electronic device in which the upgradable storage system 10 is disposed through this access. Specifically, the user can add memory devices 14 to the compartment 12 to increase memory capacity. To ensure that the memory devices 14 do not shift unnecessarily when the electronic device is moved, the upgradable storage system 10 can further include a biasing member 22 such as a spring that biases each of the memory devices 14 against each other and against the closure mechanism 20. In addition to preventing shifting of the memory devices 14, this biasing member further ensures positive contact between each adjacent memory device 14 so that the electrical connections therebetween are not interrupted.

As is further illustrated in FIG. 1, the bottom memory device 14 in the stack can be connected to an interconnect member 24 which makes electrical contact with the memory device such that this and the other memory devices can be electrically connected to other electronic components within the electronic device. Normally, the interconnect member 24 comprises a plurality of electrical pathways (not shown) that connect to contacts formed on the bottom of the bottom memory device 14. Typically, connection is made to the pathways with a connection cable 26 that is electrically connected to the other electronic component(s).

Figure 3:
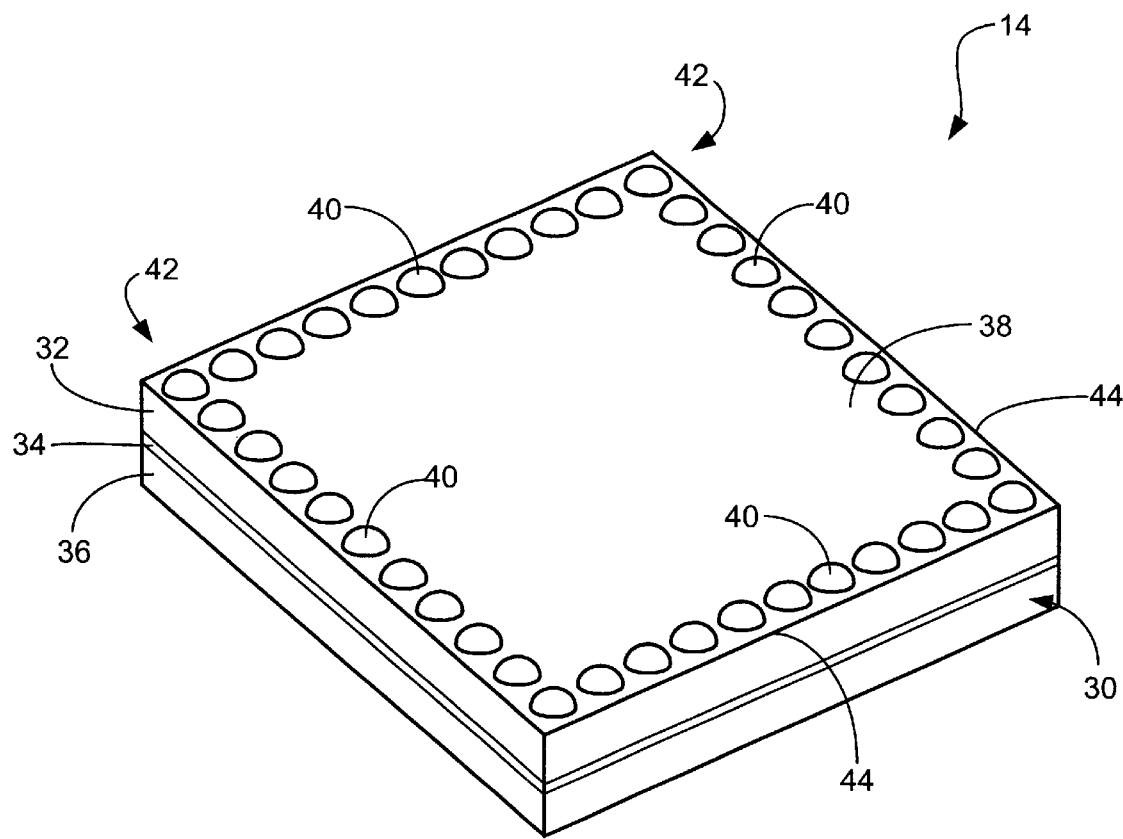
FIG. 3 is a perspective view of a memory device used in the system of FIG. 1.
Figure 4:
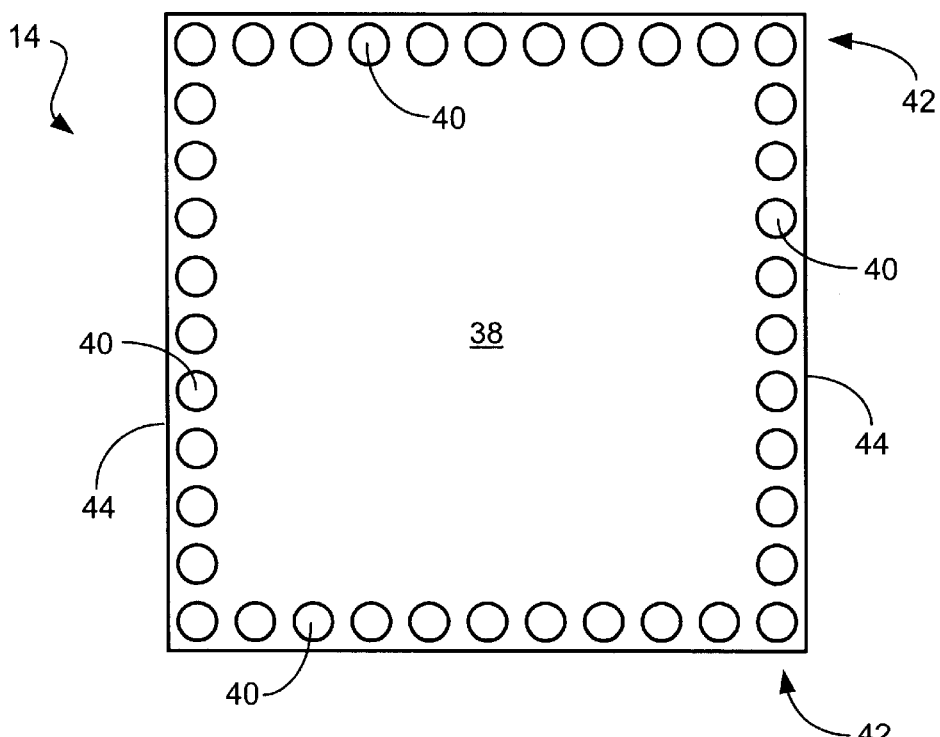
FIG. 4 is a top view of the memory device of FIG. 3.
Figure 5:
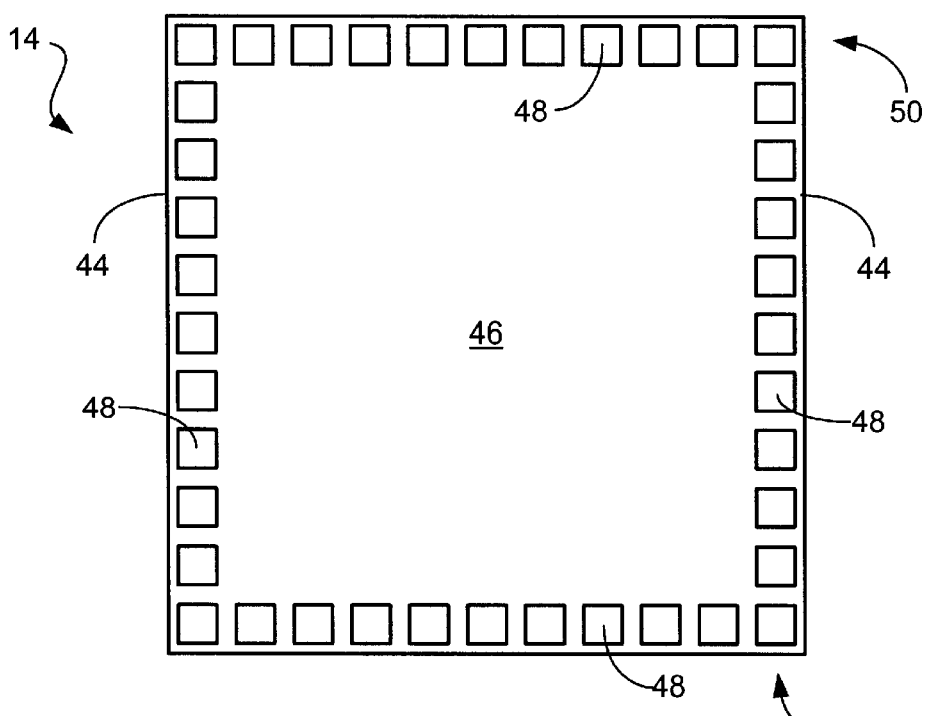
FIG. 5 is a bottom view of the memory device of FIG. 3.

Referring now to FIGS. 3–5, the memory device 14 will be described. With reference to FIG. 2, the memory device compartment 12 can further include a plurality of alignment members 28 that ensure correct alignment of each of the memory devices 14 within the compartment. By way of example, the alignment members 28 can comprise alignment rails that are positioned in the corners of the compartment 12 such that the rails securely hold the corners of the memory devices 14 to align them. As indicated most clearly in FIG. 3, the memory device 14 preferably comprises a semiconductor package that is generally rectilinear in shape. As shown in FIG. 3, the memory device 14 typically comprises one or more layers 30 of a semiconductor material such as silicon. By way of example, the memory device 14 can comprise top 32, middle 34, and bottom 36 layers of this semiconductor material. On a first or top surface 48 of the memory device 14 is a plurality of first or top contacts 40. As identified in FIG. 3, normally each of these contacts 40 is formed as a contact bump that extends upwardly from the top surface 38 of the memory device 14. By way of example, each of the contacts 40 can comprise a solder bump that is formed on the top surface 38 of the memory device 14 with conventional techniques. Normally, each of the contacts 40 is formed in rows 42 that are formed adjacent the side edges 44 of the memory device 14. By way of example, each row 42 comprises eleven contacts 40 such that, where the memory device 14 comprises four side edges 44, the device has a total of approximately forty top contacts 40.

With reference to FIG. 5, a second or bottom surface 46 of the memory device 14 similarly comprises a plurality of second or bottom contacts 48. By way of example, each of the bottom contacts 48 can comprise a solder pad that is formed on the bottom surface 46 of the device 14 with conventional techniques. As with the top contacts 38, normally each of the bottom contacts 48 is formed in a row 50 which is arranged adjacent the side edges 44 of the device 14. Typically, the number of bottom contacts 48 is equal to the number of top contacts 40 in each memory device 14 such that the top contacts 40 will make contact with the bottom contacts 48 when the memory devices 14 are arranged in a vertically stacked orientation such as that shown in FIG. 1. Accordingly, positive contact can be made with each memory device contact so that a complete electrical connection can be had between each memory device 14.

As will be understood by persons having ordinary skill in the art, the memory devices 14 can comprise substantially any solid-state device capable of storing data that is to be used by the electronic device. Preferably however, each memory device 14 comprises an atomic resolution storage (ARS) device. ARS devices are preferred in that, due to their architecture, it is feasible to form contacts on the top and bottom surfaces of the device 14. In particular, unlike conventional memory devices, ARS devices comprise several semiconductor layers which connect to each other with vias. For instance, an ARS device may comprise a middle layer having two communicating surfaces and a plurality of vias that extend to the single communicating surface of the outer layers (see FIG. 1). With such an arrangement, vias can be formed which extend through the outer layers to contacts formed on the top and bottom surfaces of the device. Therefore, the contacts can be electrically connected with the circuitry of the device in a vertical manner so as to facilitate vertical electrical connections between stacked devices.

Figure 6A:
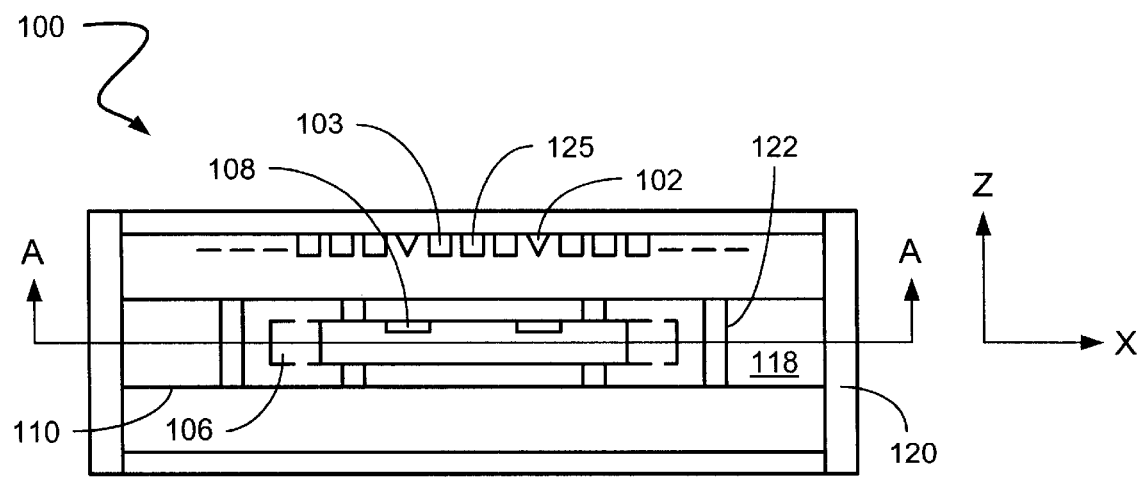
FIGS. 6A–6C various views of an ARS device that can be used as the memory device of FIGS. 2–4.
Figure 6B:
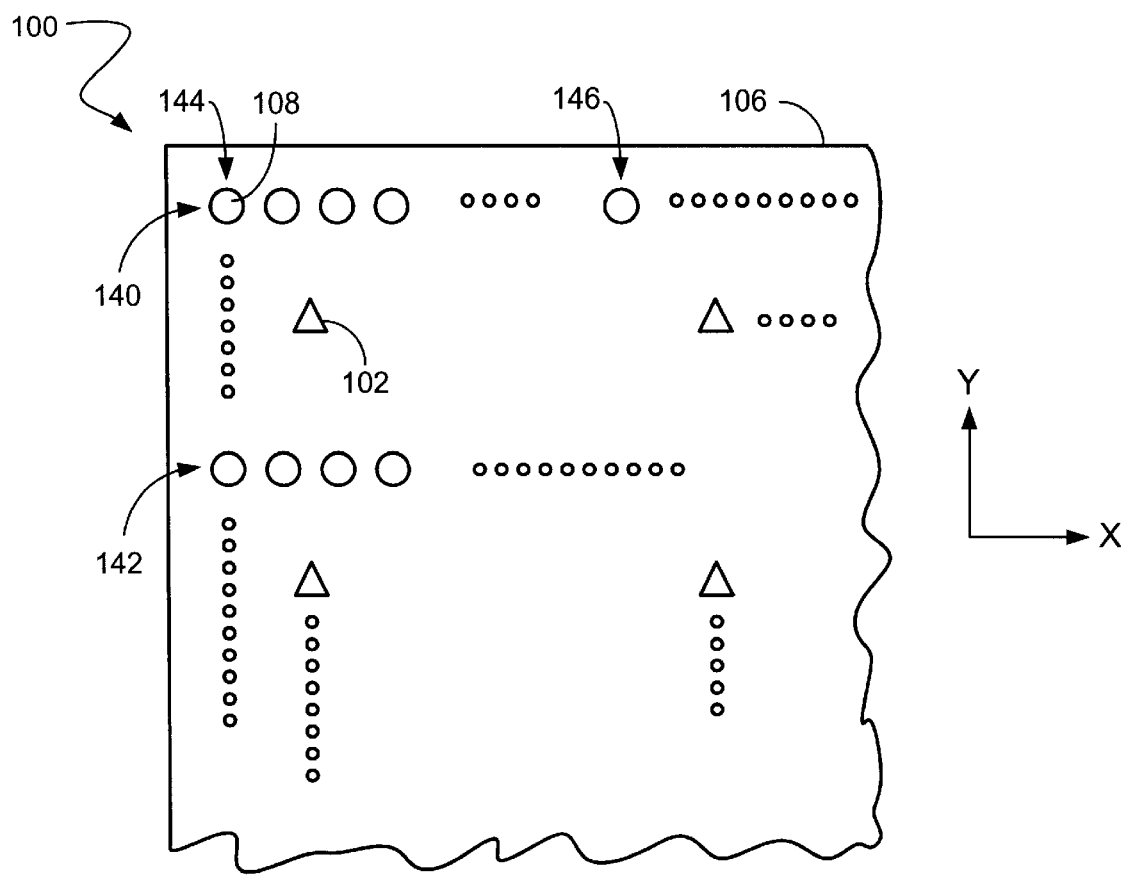
Figure 6C:
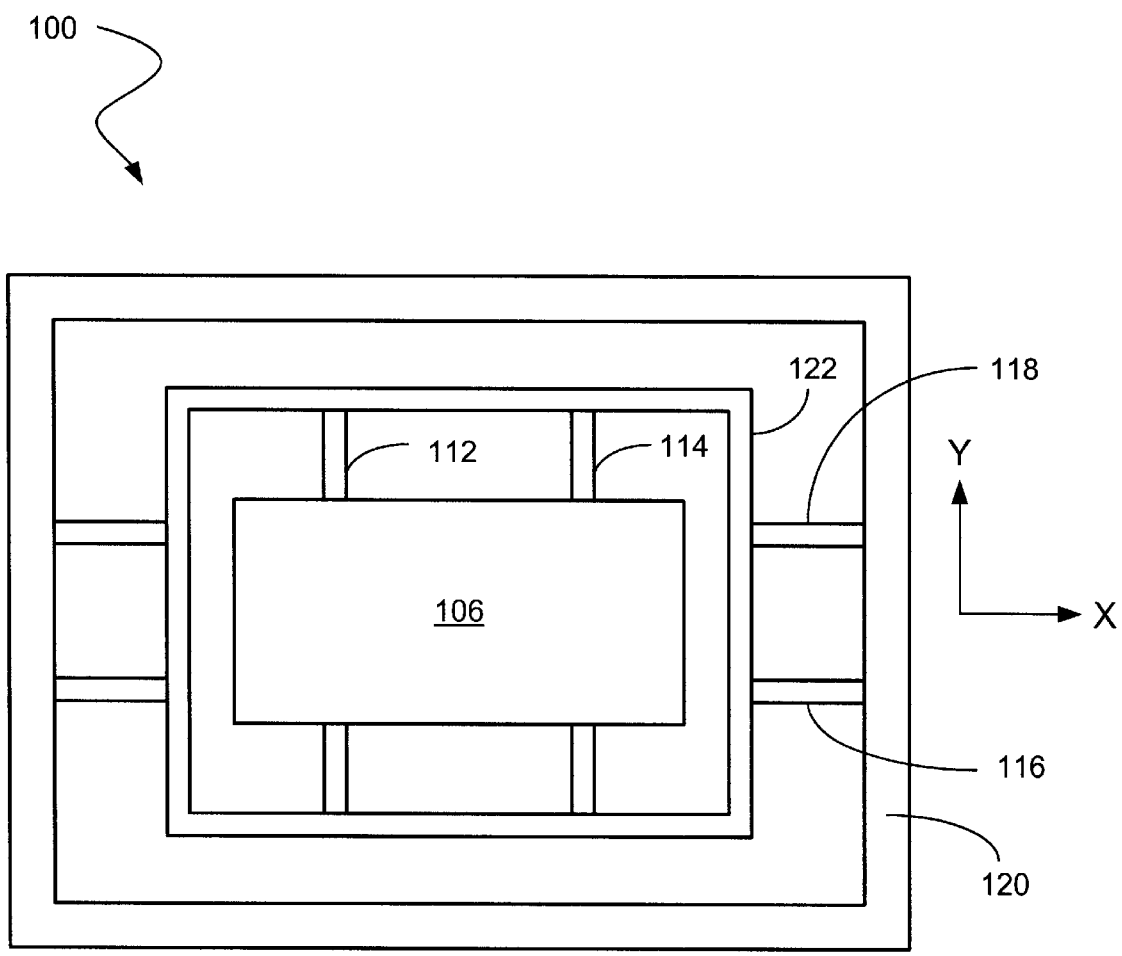
Figure 7:
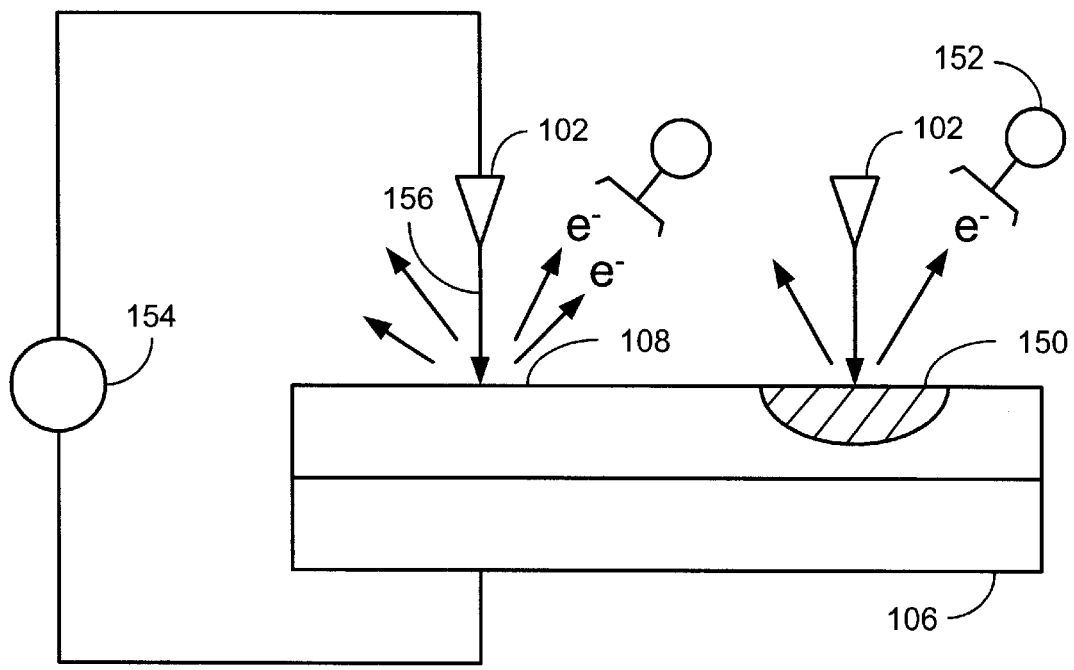
FIG. 7 a schematic view illustrating field emitters reading from storage areas of an ARS device.
Figure 8:
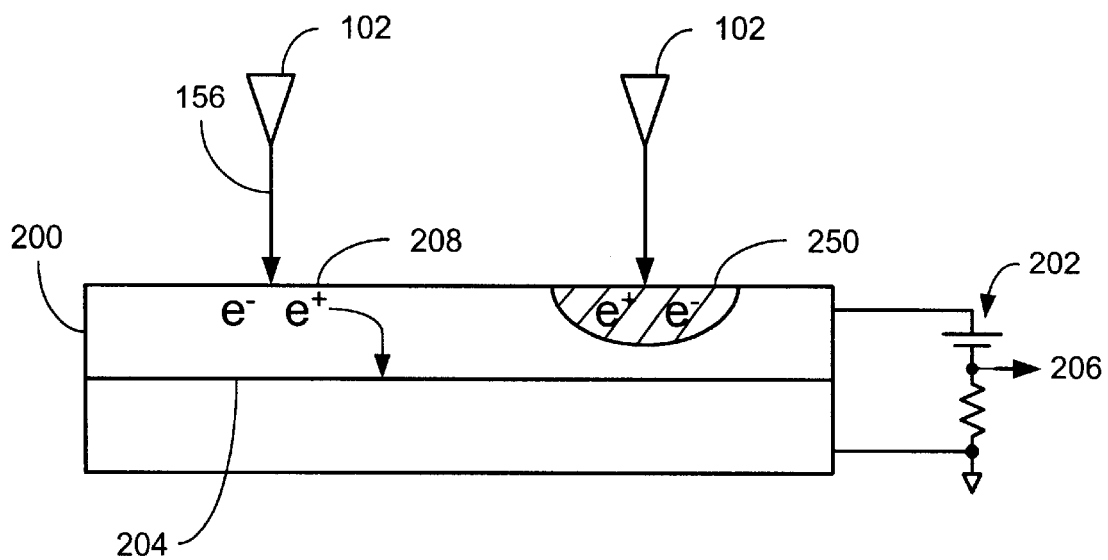
FIG. 8 is a schematic view illustrating a storage medium of an ARS device.

FIGS. 6–8 illustrate the internal structure of an ARS device 100 suitable for construction of the memory device 14 described above. The ARS device 100 shown in these figures is disclosed and described in detail in U.S. Pat. No. 5,557,596, which is hereby incorporated by reference into the present disclosure. FIG. 6A shows a side cross-sectional view of the ARS device 100. As indicated in this figure, the device 100 includes a number of field emitters 102, a storage medium 106 having a number of storage areas 108, and a micromover 110 which scans the storage medium 106 with respect to the field emitters 102 or vice versa. In a preferred embodiment, each storage area 108 is responsible for storing one bit of information. Typically, the field emitters 102 are point-emitters having very sharp tips, each tip having a radius of curvature of approximately one nanometer to hundreds of nanometers.

During operation, a predetermined potential difference is applied between a field emitter 102 and a corresponding gate such as a circular gate 103 which surrounds it. Due to the sharp tip of the emitter 102, an electron beam current is extracted from the emitter 102 towards the storage area 108. Depending upon the distance between the emitters 102 and the storage medium 106, the type of emitters 102, and the spot size (e.g., bit size) required, electron optics may be useful in focusing the electron beams. Voltage may also be applied to the storage medium 106 to either accelerate or decelerate the field's emitted electrons or to aid in focusing the field emitted electrons. In a preferred embodiment, a casing 120 maintains the storage medium 106 in a partial vacuum, such as at least $10^{-5}$ torr.

In the embodiment shown in FIG. 6A, each field emitter 102 is associated with a corresponding storage area 108. As the micromover 110 scans the medium 106 to different locations, each emitter 102 is positioned above different storage areas. With the micromover 110, an array of field emitters 102 can scan over the storage medium 106. The field emitters 102 are responsible for reading and writing information on the storage areas 108 by means of the electron beams they produce. Thus, the field emitters 102 are preferably of the type that produce electron beams which are narrow enough to achieve the desired bit density of the storage medium 106, and which provide the power density of the beam current needed for reading from and writing to the medium 106. A variety of methods are known in the art which are suitable for making such field emitters 102.

In a preferred embodiment, there can be a two-dimensional array of emitters 102, such as 100 by 100 emitters with an emitter pitch of 15 micrometers in both the X and Y directions. Each emitter 102 may access bits in tens of thousands to hundreds of millions of storage areas 108. For example, the emitters 102 can scan over the storage medium 106 (which has a two-dimensional array of storage areas 108) with a periodicity of approximately 1 to 100 nanometers between any two storage areas 108 and the range of the micromover is 15 micrometers. In addition, each of the emitters 102 may be addressed simultaneously or in a multiplexed manner. Such a parallel accessing scheme significantly reduces access time and increases data rate of the storage device 14.

A preferred micromover 110 can be made in a variety of ways as long as the micromover 10 has sufficient range and resolution to position the field emitters 102 over the storage areas 108. As a conceptual example, the micromover 110 can be fabricated by a standard semiconductor microfabrication process to scan the medium 106 in the X and Y directions with respect to the casing 120.

FIG. 6B shows a top view of the ARS device 100 and illustrates a two-dimensional array of storage areas 108 and a two-dimensional array of emitters 102. To reduce the number of external circuits, the storage medium 106 can be separated into rows, such as row 140, where each row contains a number of storage areas 108 such that each emitter 102 is responsible for a number of rows. However, in such an embodiment, each emitter 102 need not be responsible for entire length of the rows. Instead, the emitter 102 can be responsible for the storage areas 108 within rows 140 through 142, and within the columns 144 through 146. All rows of storage areas accessed by one emitter 102 typically are connected to one external circuit, for example, rows 140 through 142. To address a storage area 108, the emitter 102 responsible for that storage area 108 is activated and is displaced with the micromover 110 to that storage area 108. FIG. 6C shows a top view of the cross-section A–A of FIG. 6A and illustrates the storage medium 106 being held by two sets of thin-walled microfabricated beams 112–118. The faces of the first set of thin-walled beams are in the X-Z plane, such as 112 and 114. This set of beams may be flexed in the X direction allowing the medium 106 to move in the X direction with respect to the casing 120. The faces of the second set of thin-walled beams are in the X-Z plane, such as 116 and 118. This set of beams allows the medium to move in the Y direction with respect to the casing 120. The storage medium 106 is held by the first set of beams 112, 114, which is connected to a frame 122. The frame is held by the second set of beams 116, 118, which is connected to the casing 120. The field emitters 102 scan over the storage medium 106, or the storage medium 106 scans over the field emitters 102, in the X-Y directions by electrostatic, electromagnetic, or piezoelectric means known in the art.

In use, writing is accomplished by temporarily increasing the power density of the electron beam current to modify the surface state of the storage area 108. Reading, on the other hand, is accomplished by observing the effect of the storage area 108 on the electron beams, or the effect of the electron beams on the storage area 108. Reading is typically accomplished by collecting the secondary and/or backscattered electrons when an electron beam with a lower power density is applied to the storage medium 106. During reading, the power density of the electron beam is kept low enough so that no further writing occurs. One preferred embodiment of the storage medium 106 is a material whose structural state can be changed from crystalline to amorphous by electron beams. The amorphous state has a different SEEC and BEC than the crystalline state. This leads to a different number of secondary and backscattered electrons emitted from the storage area 108. By measuring the number of secondary and backscattered electrons, the state of the storage area 108 can be determined. To change from the amorphous to the crystalline state, the beam power density can be increased and then slowly decreased. This increase/decrease heats the amorphous area and then slowly cools it so that the area has time to anneal into its crystalline state. To change from the crystalline to amorphous state, the beam power density is increased to a high level and then rapidly decreased. An example of one such type of material is germanium telluride (GeTe) and ternary alloys based on GeTe.

FIG. 7 schematically illustrates the field emitters 102 reading from the storage medium 106. In this figure, the state of one storage area 150 has been altered, while the state of another storage area 108 has not. When electrons bombard a storage area 108, both the secondary electrons and backscattered electrons are collected by the electron collectors, such as 152. An area that has been modified will produce a different number of secondary electrons and backscattered electrons, as compared to an area that has not been modified. The difference may be greater or lesser depending upon the type of material and the type of modification made. By monitoring the magnitude of the signal current collected by the electron collectors 152, the state of and, in turn, the bit stored in the storage area can be identified.

FIG. 8 illustrates a diode approach for construction of the storage device 14. In this approach, the storage medium 106 is based on a diode structure 200, which can be a PN junction, a schottky, barrier, or any other type of electronic valve. Although FIG. 8 illustrates a particular external circuit 202, it will be appreciated that this circuit is provided for purposes of example only. The basic idea is to store bits by locally altering the surface of a diode in such a way that collection efficiency for minority carriers generated by the altered region is different from that of an unaltered region. The collection efficiency for minority carriers is defined as the fraction of minority carriers generated by the instant electrons which are swept across the diode junction 204 when it is biased by an external circuit 202 to cause a signal current 206 to flow in the external circuit 202. In use, the field emitters 102 emit narrow beams 156 of electrons onto the surface of the diode 200. The incident electrons excite electron-hole pairs near the surface of the diode 200. Because the diode 200 is reverse-biased by the external circuit 202, the minority carriers that are generated by the incident electrons are swept toward the diode junction 204. Electrons that reach the PN junction 204 are then swept across the junction 204. Accordingly, minority carriers that do not recombine with majority carriers before reaching the junction are swept across the junction, causing a current flow in the external circuit 202.

Writing onto the diode 200 is accomplished by increasing the power density of the electron beam enough to locally alter the physical properties of the diode 200. This alteration affects the number of minority carriers swept across the junction 204 when the same area is radiated with a lower power density read electron beam. For instance, the recombination rate in a written area 250 could be increased relative to an unwritten area 108 so that the minority carriers generated in the written area 250 have an increased probability of recombining with minority carriers before they have a chance to reach and cross the junction 204. Hence, a smaller current flows in the external circuit 202 when the read electron beam is incident upon a written area 250 than when it is incident upon an unwritten area 208. Conversely, it is also possible to start with a diode structure having a high recombination rate and to write bits by locally reducing the recombination rate. The magnitude of the current resulting from the minority carriers depends upon the state of the storage area 106 and the current continues the output signal 206 to indicate the bit stored.

Irrespective of the type of memory device 14 used in the upgradable storage system 10, the system can be used to increase the storage capacity of an electronic device. For instance, where the electronic device comprises a digital camera, a certain amount of memory may be necessary for taking still photographs. Accordingly, the camera can be sold having a predetermined amount of storage capacity suitable for taking such still photographs. However, if the camera also has the capability of taking video images, it may be necessary to increase the storage capacity of the camera in that video data normally requires more storage space than still photograph data. In such a situation, the user can purchase additional memory devices 14 and insert them into the memory device compartment 12 of the camera so as to increase the storage capacity of the camera.

By way of example, where the memory devices 14 comprise ARS devices, a memory capacity increase of approximately 2 gigabytes can be had with the addition of each new memory device. To aid the user in correctly inserting the new memory device 14 into the compartment 12, the memory device and the compartment can include a key notch and key, respectively, (not shown) such that the memory devices can only be inserted into the compartment in a particular orientation. Such an arrangement would ensure that each of the memory devices 14 is correctly aligned with its adjacent memory devices so that proper electrical connection is had between each of the devices. To improve the contact made between each of the devices 14 and to reduce the potential for electrical contact being interrupted, Z-axis conductive adhesive (not shown) can be used between each memory device 14. As is known in the art, this conductive adhesive material is available in sheets of material which can be cut or preformed to the general footprint of the memory devices such that the material can be placed in-between the memory devices and, in particular, in between the contacts 40 and 48 of the top and bottom memory device surfaces, respectively.

Although a biasing member 22 is illustrated as being disposed underneath the bottom memory device 14 in FIG. 1, it is to be understood that alternative arrangements are possible. For instance, the reverse arrangement could be used in which the closure mechanism 20 incorporates a biasing member that urges the memory devices 14 downwardly into the memory device compartment 12. Therefore, it is to be understood that the arrangement shown in FIG. 1 is only representative of the type of arrangement possible in the construction of the upgradable storage system 10. Accordingly, emphasis is not placed upon the particular embodiments shown herein and instead is placed upon the general concept of providing a vertical stacking arrangement of memory devices which facilitates simple addition of additional memory devices. While particular embodiments of the invention have been disclosed in detail in the foregoing description and drawings for purposes of example, it will be understood by those skilled in the art that variations and modifications thereof can be made without departing from the scope of the invention as set forth in the following claims.

What is claimed is:

1. An upgradable storage system, comprising:
   a memory device compartment adapted to receive memory devices in a stacked orientation; and
   at least two memory devices disposed within the memory device compartment in a stacked orientation in which the memory devices directly contact each other so as to electrically connect with each other.

2. The system of claim 1, wherein each of the memory devices has electrical contacts disposed on opposed top and bottom surfaces of the memory devices with which the memory devices electrically connect to each other.

3. The system of claim 1, further comprising a biasing member that biases the memory devices together within the memory device compartment.

4. The system of claim 1, further comprising an interconnection member that is electrically connected to one of the memory devices and a connection cable that is connected to the interconnection member, wherein the connection cable is adapted to electrically connect to a separate electrical component.

5. The system of claim 1, further comprising at least one alignment member disposed within the memory device compartment that ensures correct alignment of the memory devices within the compartment.

6. The system of claim 1, further comprising a closure mechanism that closes the memory device compartment.

7. The system of claim 1, wherein the memory devices are ARS devices.

8. An upgradable storage system, comprising:
   a memory device compartment adapted to receive a plurality of memory devices in a stacked orientation;
   an interconnect member adapted to electrically connect with at least one memory device;
   a connection cable electrically connected to the interconnect member and adapted to connect to a separate electrical component; and
   a biasing member disposed within the memory device compartment, the biasing member adapted to bias the stacked memory devices together such that electrical contact is maintained between the memory devices.

9. The system of claim 8, further comprising at least one alignment member disposed within the memory device compartment that is adapted to ensure correct alignment of the stacked memory devices within the compartment.

10. The system of claim 8, wherein the storage system comprises a closure mechanism that closes the memory device compartment.

11. The system of claim 8, further comprising at least one memory device disposed within the memory device compartment.

12. The device of claim 11, wherein each memory device has electrical contacts disposed on opposed first and second surfaces with which the memory device is adapted to electrically connect to another memory device in the memory device compartment.

13. The device of claim 12, wherein the memory device is an ARS device.

14. A memory device, comprising:
    at least one layer of semiconductor material;
    a first and a second surface;
    a plurality of electrical contacts provided on the first surface; and
    a plurality of electrical contacts provided on the second surface, these contacts being positioned so as to make contact with the first surface electrical contacts of a similarly constructed memory device such that the memory devices can be electrically connected in a stacked orientation.

15. The memory device of claim 14, wherein the electrical contacts of one of the first and second surfaces comprise solder bumps that extend out from the device.

16. The memory device of claim 14, wherein the electrical contacts of one of the first and second surfaces comprise contact pads.

17. The memory device of claim 14, wherein the electrical contacts are arranged around the perimeter of the first and second surfaces.

18. The memory device of claim 14, wherein the memory device is an ARS device.

19. The system of claim 1, wherein the memory devices each comprise:
    at least one layer of semiconductor material;
    a first and a second surface;
    a plurality of electrical contacts provided on the first surface; and
    a plurality of electrical contacts provided on the second surface, these contacts being positioned so as to make contact with the first surface electrical contacts of a similarly constructed memory device such that the memory devices can be electrically connected in a stacked orientation.

20. The memory device of claim 19, wherein the electrical contacts of one of the first and second surfaces comprise solder bumps that extend out from the device.

21. The memory device of claim 19, wherein the electrical contacts of one of the first and second surfaces comprise contact pads.

22. An electrical device, comprising:
an upgradable storage system that includes:
- a memory device compartment adapted to receive memory devices in a stacked orientation; and
- at least two memory devices disposed within the memory device compartment in a stacked orientation in which the memory devices directly contact each other so as to electrically connect with each other.

23. The device of claim 22, wherein each of the memory devices has electrical contacts disposed on opposed top and bottom surfaces of the memory devices with which the memory devices electrically connect to each other.

24. The device of claim 22, wherein the storage system further comprises a biasing member that biases the memory devices together within the memory device compartment.

25. The device of claim 22, wherein the memory devices are ARS devices.

* * * * *